US007691288B2

(12) United States Patent
Wang et al.

(10) Patent No.: US 7,691,288 B2
(45) Date of Patent: Apr. 6, 2010

(54) THICK FILM GETTER PASTE COMPOSITIONS WITH PRE-HYDRATED DESICCANT FOR USE IN ATMOSPHERE CONTROL

(75) Inventors: Carl B. Wang, Raleigh, NC (US); Christopher John Roach, Apex, NC (US); Fong-Pei Chang, Taoyuan (TW)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/489,634

(22) Filed: Jun. 23, 2009

(65) Prior Publication Data

US 2009/0263587 A1   Oct. 22, 2009

Related U.S. Application Data

(62) Division of application No. 11/183,412, filed on Jul. 18, 2005, now abandoned.

(51) Int. Cl.
*H01J 1/56* (2006.01)
*H01J 35/20* (2006.01)
*H01J 7/18* (2006.01)
*C03C 8/02* (2006.01)
*C03C 8/16* (2006.01)

(52) U.S. Cl. .............. 252/181.1; 252/181.6; 252/181.7; 252/194; 501/14; 501/15; 501/16; 501/17; 501/21; 501/32; 501/77

(58) Field of Classification Search ............... 252/181.1
See application file for complete search history.

(56) References Cited

U.S. PATENT DOCUMENTS

| 275,613 | A | | 4/1883 | Edison |
| 1,626,682 | A | | 5/1927 | Macrae |
| 1,655,248 | A | | 1/1928 | Sharp |
| 2,295,694 | A | | 9/1942 | Slack et al. |
| 3,235,089 | A | * | 2/1966 | Burroughs ............... 210/510.1 |
| 3,338,034 | A | | 8/1967 | Hemstreet |
| 3,414,417 | A | * | 12/1968 | Miller et al. .................. 524/46 |
| 3,598,761 | A | * | 8/1971 | Woulbroun et al. ......... 252/514 |
| 4,424,144 | A | | 1/1984 | Pryor et al. |
| 4,433,016 | A | * | 2/1984 | Neely, Jr. ..................... 428/34 |
| 4,615,823 | A | * | 10/1986 | Tokuyama et al. .......... 252/194 |
| 5,244,707 | A | * | 9/1993 | Shores ........................ 428/76 |
| 5,284,712 | A | | 2/1994 | Kawai et al. |
| 5,300,324 | A | | 4/1994 | Croft et al. |
| 5,401,706 | A | * | 3/1995 | Fischer ....................... 502/401 |
| 5,434,472 | A | | 7/1995 | Van Den Boom |
| 5,460,796 | A | | 10/1995 | Verdujin |
| 5,498,925 | A | | 3/1996 | Bell et al. |
| 5,591,379 | A | * | 1/1997 | Shores ....................... 252/194 |
| 5,633,559 | A | * | 5/1997 | Hens et al. .................. 313/408 |
| 6,004,477 | A | | 12/1999 | Nakagawa et al. |
| 6,226,890 | B1 | | 5/2001 | Boroson et al. |
| 6,245,699 | B1 | * | 6/2001 | Hudecek et al. ............... 501/18 |
| 6,483,238 | B1 | * | 11/2002 | Baret et al. .................. 313/582 |
| 6,548,040 | B1 | | 4/2003 | Rouleau et al. |
| 6,835,682 | B2 | * | 12/2004 | Cho et al. ..................... 501/32 |
| 6,848,964 | B1 | * | 2/2005 | Sasaki et al. .................. 445/25 |
| 6,875,463 | B2 | * | 4/2005 | Mifune et al. ................ 427/64 |
| 7,030,048 | B2 | * | 4/2006 | Cho et al. ..................... 501/69 |
| 7,214,429 | B2 | * | 5/2007 | Kato et al. .................. 428/406 |
| 7,309,669 | B2 | | 12/2007 | Sumi et al. |
| 7,438,829 | B2 | | 10/2008 | Cho et al. |
| 7,494,604 | B2 | * | 2/2009 | Cho et al. ................. 252/181.6 |
| 7,569,505 | B2 | * | 8/2009 | Besinger et al. ............... 501/79 |
| 2001/0054871 | A1 | | 12/2001 | Tadaki et al. |
| 2002/0017864 | A1 | * | 2/2002 | Watanabe et al. ........... 313/586 |
| 2002/0041845 | A1 | | 4/2002 | Oku et al. |
| 2002/0046861 | A1 | | 4/2002 | Yokoyama et al. |
| 2002/0176933 | A1 | * | 11/2002 | Mifune et al. ............... 427/162 |

(Continued)

FOREIGN PATENT DOCUMENTS

EP   0707360 A   4/1996

(Continued)

OTHER PUBLICATIONS

D. W. Breck, Zeolite Molecular Sieves, John Wiley and Sones, New York, 1974 (Book Not Included).

*Primary Examiner*—Joseph D Anthony

(57) ABSTRACT

The invention is directed to a process for making screen-printable getter composition comprising: (a) glass frit; and (b) pre-hydrated desiccant material; dispersed in (c) organic medium. The present invention further relates to a getter composition utilizing low-softening temperature glasses comprising, based on weight %, 1-50% $SiO_2$, 0-80% $B_2O_3$, 0-90% $Bi_2O_3$, 0-90% PbO, 0-90% $P_2O_5$, 0-60% $Li_2O$, 0-30% $Al_2O_3$, 0-10% $K_2O$, 0-10% $Na_2O$, and 0-30% MO where M is selected from Ba, Sr, Ca, Zn, Cu, Mg and mixtures thereof. The glasses described herein may contain several other oxide constituents that can substitute glass network-forming elements or modify glass structure.

The desiccant material is pre-hydrated to reach its saturation level of moisture absorption. The process of pre-hydration can be done by exposing the desiccant in a normal temperature/humidity environment of for example, 25° C. and 50-60% RH. For 24 to 48 hours or up to the time when weight gain (due to moisture absorption) stops increasing. An accelerated hydration process in a chamber with higher than normal humidity level (i.e. 50% Relative Humidity) is also applicable to shorten the time of exposure to fully hydrate the desiccant material.

6 Claims, No Drawings

U.S. PATENT DOCUMENTS

| | | |
|---|---|---|
| 2005/0104032 A1* | 5/2005 | Cho et al. ............... 252/181.1 |
| 2005/0238803 A1* | 10/2005 | Tremel et al. ............... 427/180 |
| 2006/0283546 A1* | 12/2006 | Tremel et al. ............... 156/291 |
| 2006/0284556 A1* | 12/2006 | Tremel et al. ............... 313/512 |
| 2008/0030654 A1* | 2/2008 | Slutsky et al. ............... 349/70 |
| 2008/0171801 A1* | 7/2008 | Cho et al. ............... 522/42 |
| 2008/0272694 A1* | 11/2008 | Tremel ............... 313/553 |
| 2009/0160600 A1* | 6/2009 | Yanagida et al. ............... 338/21 |
| 2009/0263587 A1* | 10/2009 | Wang et al. ............... 427/385.5 |

FOREIGN PATENT DOCUMENTS

| | | |
|---|---|---|
| EP | 0884930 A1 | 12/1998 |
| EP | 1533026 A | 5/2005 |
| WO | 01/19142 A1 | 3/2001 |
| WO | 02/43098 A1 | 5/2002 |
| WO | 2005/050736 A | 7/2009 |

* cited by examiner

THICK FILM GETTER PASTE COMPOSITIONS WITH PRE-HYDRATED DESICCANT FOR USE IN ATMOSPHERE CONTROL

This application is a divisional application of Ser. No. 11/183,412 filed on Jul. 18, 2005.

FIELD OF THE INVENTION

The invention is directed to thick film getter paste compositions with pre-hydrated desiccant for use in controlling moisture, oxygen, and small organic molecule levels in sensitive electronic and photonic devices.

BACKGROUND OF THE INVENTION

The invention describes thick film getter compositions for use in controlling moisture, oxygen, and small organic molecule levels. Many packaged devices are susceptible to damage from undesired levels of moisture, oxygen, and small organic molecules and this is especially so in the case of various electronic, display, and light sensing or emitting devices. Examples of the types of damage caused or aggravated by the gas or condensed phase impurities include; hydration, oxidation, corrosion, and ion migration. In the case of FED (Field Emission Display) or SED (Surface Emission Display), the residue gasses may cause the undesirable modification of the emitter tip surface work function and degrade the performance. The concept of using a getter to control the atmosphere within packaged devices has been known for many years. Getters are substances that are added to a system or mixture to consume or deactivate traces of undesirable gas phase impurities including moisture.

One approach to minimizing the deleterious effects of gas phase impurities has involved the enclosure of sensitive devices with inorganic or organic barriers to physically separate the active materials from external atmospheric oxygen and moisture. This approach has had some success, but it does not always adequately address the problems caused by even those small amounts of gas phase impurities trapped within the enclosure or diffusing into the enclosure over time.

The use of getters for controlling gas phase impurities within a sealed enclosure for an electronic component or device is well known. These sealed enclosures are designed to protect sensitive electronic components and devices from gas phase impurities including moisture that come from outside environmental contaminants and/or internally created outgassing or desorption from various functional components. For example, a great many of display devices such as PDP (Plasma Display Panel), CRT (Cathode Ray Tube), FED (Field Emission Display), LCD (Liquid Crystal Display), LED (Light Emitting Diode) are highly sensitive and can only tolerate very low levels of gas phase impurities. At the same time, mass production of these devices dictates that the getter composition be easily processed while providing sufficient adhesion to any chosen substrate. The present invention provides a superior composition and process to accommodate these requirements.

Prior art getters and their use in electronic applications are described below. Typically, the getter materials are not screen-printable, and normally are comprised of a desiccant material (i.e., zeolite, silica gel, etc.) and a binder. The binder may be organic or inorganic. The following illustrates the specifics of the prior art.

U.S. Pat. No. 5,244,707 to Shores discloses a sealed enclosure of an electronic device which incorporates a coating or adhesive with desiccant properties. The coating or adhesive comprises a protonated aluminum silicate powder dispersed in polymer.

U.S. Pat. No. 5,591,379 to Shores teaches a composition of matter useful as a desiccant in a hermetic electronic device, comprising a powder dispersed in a binder, wherein said powder is selected from the group consisting of zeolite molecular sieves, activated alumina, silica gel, alkaline earth oxide, and alkali metal carbonate; said binder is a continuous matrix of porous glass or porous ceramic; and said powder to binder volume ratio is 0.001-2. The glasses disclosed for use as a binder must be made porous by creating channels for water vapor to penetrate. This may be done by various techniques known in the art, such as the use of blowing agents, fast evaporation of water or other gases during formation, fast decomposition of organometallic polymers and low temperature or incomplete sintering.

U.S. Pat. No. 1,626,682 to MacRae discloses a multi-pixel flat panel display which includes spaced apart first and second electrodes, with a patterned solid material layer in contact with at least one of the electrodes, and preferably placed between the two electrodes. The patterned layer (the web) includes a multiplicity of apertures, with at least one aperture associated with any given pixel. In the aperture is disposed a quantity of a second material, exemplarily, a phosphor in the case of a flat panel field emission display, or a color filter material in the case of a liquid crystal display. The web can facilitate second material deposition by means of screen-printing. The web also can facilitate provision of spacer structure between two electrodes, and can include getter or hygroscopic material.

U.S. Pat. No. 5,401,706 to Fischer teaches a process for making a desiccant-coated substrate capable of being used at temperatures above 150 degrees Fahrenheit, the desiccant being in the form of particles and the particles having pores and being adhered to the substrate by a binder, the coated substrate being sufficiently flexible and the coating having sufficient adherence to the substrate so that the coated substrate can be formed into corrugated shapes, the desiccant particles in the coated substrate having at least 60% of their original adsorption capacity and the binder having good breathability; said process comprising the steps: (a) forming an aqueous suspension comprising particles of one or more desiccants, a water-based organic binder, a suspending agent to help maintain the desiccant particles in suspension, and an organic pore-clearing agent at least some of which enters at least some of the pores of the desiccant particles; (b) depositing the suspension on the substrate; and (c) causing the binder of the deposited suspension to set so that the deposited desiccant particles adhere to the substrate and causing at least some of the pore-clearing agent to leave the pores of the desiccant particles to prevent the binder from occluding at least some of the pores of the adhered desiccant particles, thereby to form a desiccant-coated substrate capable of being used at temperatures above 150 degrees Fahrenheit and of sufficient flexibility and having a coating having sufficient adherence to the substrate so that the desiccant-coated substrate can be formed into corrugated shapes and in which the desiccant particles in the coated substrate have at least 60% of their original adsorption capacity and in which the binder has good breathability.

Commonly assigned, U.S. National patent application Ser. No. 10/712,670 to Cho et al provides a screen-printable thick film getter composition comprising glass which may be used to promote densification at relatively low sintering temperatures of 400-650° C. and to provide increased adhesion between the thick film and the substrate. Furthermore, the composition of Cho et al may be utilized in display devices which often require humidity control to levels below about 1000 ppm and in specific cases below 100 ppm. However, the thick film compositions of Cho et al may become unstable during generation of the thick film composition itself, due to the absorption of moisture from the atmosphere during processing. This absorption of moisture may lead to the generation of heat and possible safety concerns during composition processing. Furthermore, this absorption of moisture during thick film composition formation may modify the composition rheology, which is problematic during application.

The present invention provides a screen-printable thick film getter composition comprising glass which may be used to promote densification at low densification temperatures in the range of 400-650° C. and to provide increased adhesion between the thick film and the substrate. Another key ingredient in the getter composition is a pre-hydrated desiccant wherein the process of pre-hydration provides stability of (1) the desiccant under normal temperature/humidity environment and (2) the rheological behavior of the getter composition. Furthermore, the composition of the present invention may be utilized in electronic and photonic devices which often require humidity control to levels below about 1000 ppm and in specific cases below 100 ppm.

SUMMARY OF THE INVENTION

The invention is directed to a screen-printable getter composition comprising: (a) glass frit; dispersed in (b) organic medium. The invention is further directed to a screen-printable getter composition comprising: (a) glass frit; and (b) pre-hydrated desiccant material; dispersed in (c) organic medium.

The present invention further relates to a getter composition utilizing low-softening temperature glasses comprising, based on weight %, 1-50% $SiO_2$, 0-80% $B_2O_3$, 0-90% $Bi_2O_3$, 0-90% PbO, 0-90% $P_2O_5$, 0-60% $Li_2O$, 0-30% $Al_2O_3$, 0-10% $K_2O$, 0-10% $Na_2O$, and 0-30% MO where M is selected from Ba, Sr, Ca, Zn, Cu, Mg and mixtures thereof. The glasses described herein may contain several other oxide constituents that can substitute glass network-forming elements or modify glass structure.

DETAILED DESCRIPTION OF INVENTION

The thick film getter composition of the present invention is a screen-printable ceramic composition, which may be formed on a substrate, for example, a glass substrate acting as a lid in various electronic display devices. The thick film getter acts as a gas phase absorbent at various environmental conditions of a few thousands ppm to a few ppm levels. The present invention is not limited to display device applications, but can be used for any other microelectronic device applications where the device lifetime can be degraded by or sensitive to the presence of gas phase impurities.

Furthermore, the thick film getter paste is primarily intended to be used for various display applications including organic light emitting diodes (OLED) and electroluminescence (EL), where lifetime of the display devices are strongly related to the control of humidity and other harmful gases. The organic light emitting materials in OLED and EL devices are degraded by high temperatures, so organic sealing materials are typically used instead of the more hermetic fired glass or glass-to-metal seals. The organic light emitting applications differ from other hermetic microelectronic devices in that the moisture gettering is working at highly moisture-sensitive or gas-sensitive environments. The display devices often require humidity control to levels below about 1000 ppm and in specific cases below 100 ppm.

Many of the other display and light emitting packages are inorganic with the more hermetic type of fired seals that are designed to maintain vacuum. In these packages, the thick film getter has particular value for absorbing oxygen and trace organic residue. CNT (carbon nanotube) and FED (field emission displays) are examples of a sensitive fired package device where oxygen and outgassing from trace organic residue have both been demonstrated to degrade performance. In a FED, the nanotubes act as low work function electron guns. When they are hot, they can be oxidized by traces of oxygen within the sealed glass panel structure. Outgassed organic residuals also tend to deposit on and coat the CNT's, thus decreasing their electron emission efficiency. CNT's are susceptible to damage from gas phase impurities regardless of whether they are deposited/oriented by thick film methods or grown directly by CVD. Other materials in the various types of displays also have a recognized sensitivity to various gas phase impurities. Examples include the various R-G-B light emitting inorganic phosphor materials that are common to all of the emissive and plasma displays (FED, SED, PDP, & CRT). All of the phosphor materials and some of the electrode materials have recognized sensitivities to various gas phase impurities. The compositions of the present invention may be utilized in each of the applications listed above.

The thick film getter composition is comprised of a mixture of glass powder and desiccant material dispersed in an organic medium. The desiccant materials useful in the present invention include any materials or mixtures of materials which are capable of absorbing impurities and are compatible with the required substrate processing conditions (i.e., the desiccant material must be able to withstand the firing conditions required for processing. Typically, the substrate is a glass or ceramic material and processing conditions include a firing temperature of up to 600° C.).

The organic medium is comprised of organic polymeric binder and volatile organic solvent. In one embodiment, zeolite, a desiccant material or other material that absorbs impurities, such as hydrogen or other gases can be used alone or as a mixture. Usually, the desiccant material is the main functional part of the thick film getter, which determines its performance of gas phase impurity absorption. Generally, the capacity of gas phase impurities absorption proportionally depends on the relative content of the desiccant material along with the retained level of open porosity after firing. The glass component is primarily selected based on its ability to provide a low densification temperature in the range of 400-650° C., good adhesion between the sintered thick film and substrate, and maintenance of a reasonable level of open porosity in the fired Zeolite particles. Firing temperature is also limited by the choice of the lid and substrate materials and TCE stresses. For example, a firing temperature below 650° C. is necessary for the typical soda lime glass substrate to prevent warpage. In case of ceramic or certain metal-based substrates, a temperature above 650° C. may be allowed.

Adhesion between the getter film and substrate is improved by the existence of a low softening point glass. Glass can help relieve interface stress by facilitating penetration of glass into voids of substrates via viscous flow during firing. Mechanical locking is likely to be the dominant mechanism for adhesion between thick film and substrate. However, the actual adhesion mechanism may vary and depends on the choice of substrate and thick film composition.

In the present invention, the glass does not necessarily form a continuous matrix in unfired or fired structure. Before firing, the glass and desiccant are dispersed in the organic media to form a viscous paste. In the early stages of sintering the moisture, that was intentionally added to hydrate the Zeolite, evaporates. The evaporation and decomposition of the organic media also occurs before the actual consolidation of solid particles. In the later stages of sintering the glass begins to soften and wet the surface of desiccant particles and the surface of the substrate. The sintered getter layer is densified by the viscous glass flow. The final fired structure depends on the type of solids and their relative content.

The glass itself is not porous and it is not necessary to produce the glass by a special fabrication process, such as fast evaporation of water or glasses, the use of blowing or bubbling agents, any chemical hollow process and low temperature firing, to intentionally generate pores in the glass. Rather, it is important to achieve a highly dense or essentially void-free macrostructure with the proper choice of glass chemistry and sintering process of the resultant getter paste composition.

The hardness and mechanical strength of the film primarily depend on the content and type of glass. The mechanical integrity is assumed to be important because weak film structure can be damaged by an external mechanical shock. It is not necessary to maintain high levels of porosity in the glass itself for better performance of moisture absorption, since microstructure porosity is provided by the other key desiccant ingredient(s) in the getter paste composition.

The thick film getter composition, as described herein, is bonded to substrate by depositing the thick film composition onto the substrate and firing the substrate. Depending on the device structure and its required performance, thickness of the getter film may be adjusted by sequentially printing and drying the paste. A typical thickness of the thick film getter after single printing and subsequent firing ranges from 10 to 40 microns. An excessively thick getter film is unnecessary as long as strong absorption of moisture is provided by a getter film of normal thickness.

Although screen-printing is used as the common method for the deposition of thick film getter paste, any other methods including stencil printing, syringe dispensing, or other deposition or casting techniques may be utilized.

This invention is based on the finding that thick film getter compositions (sometimes referred to as "pastes") can be made by combining low softening temperature glasses with desiccant material in an organic medium. More specifically, the desiccant material is pre-hydrated to reach its saturation level of moisture absorption. The composition and pre-hydration process and results are described in further details below.

Inorganic Composition

The inorganic composition of thick film getter paste is comprised of a glass frit powder and a desiccant material.

The glass frit powder is essential to the composition to promote adhesion to the substrate and densification of the composition upon firing process. It has been determined that the adequate levels of glass must be within the range of 10 wt % to 30 wt % and preferably within 10 and 20 weight %, based on the total solid weight % including frit and pre-hydrated desiccant.

The present invention relates to low-softening temperature glasses comprising, based on weight %, 1-50% $SiO_2$, 0-80% $B_2O_3$, 0-90% $Bi_2O_3$, 0-90% PbO, 0-90% $P_2O_5$, 0-60% $Li_2O$, 0-30% $Al_2O_3$, 0-10% $K_2O$, 0-10% $Na_2O$, and 0-30% MO where M is selected from Ba, Sr, Ca, Zn, Cu, Mg and mixtures thereof. The glasses described herein may contain several other oxide constituents. For instance, $ZrO_2$ and $GeO_2$ may be partially incorporated into the glass structure. Hygroscopic lithium-based silicates or phosphate glasses may also be applied for the getter purpose. Furthermore, the glass compositions of the present invention are not required to be made porous by creating channels for water vapor to penetrate.

High content of Pb, Bi or P in glass provides a very low softening point that allows thick film pastes to become dense below 650° C. These glasses are not crystallized during firing, since these additional elements tend to provide good stability of glass and a high solid solubility for other constituents in the glass recipe. In addition, the existence of a large content of phosphorous may be useful in gettering moisture without affecting the degree of densification. Li-based silicate glasses may also be used in this application, since they are sensitive to moisture and can be densified at low temperature below 650° C. However, the content of Li is to be adjusted to reach full densification before crystallization happens.

Other glass modifiers or additives may be added to modify glass properties for better compatibility with a given substrate. For example, Temperature Coefficient of Expansion (TCE) of the glass may be adjusted by the relative content of other glass constituents in the low-softening temperature glasses.

The glasses described herein are produced by conventional glass making techniques. More specifically, the glasses may be prepared as follows. The glasses were prepared in the batch size of 500-2000 gram. Typically, the ingredients were weighed then mixed in the desired proportions and heated in a bottom-loading furnace to form a melt in platinum alloy crucibles. Heat was applied to reach a peak temperature of 1100-1400° C. and for a time duration for the melt to become a homogeneous liquid. The glass melt was quenched by a counter rotating stainless steel roller to form a 10-20 mil thick platelet of glass. The resulting glass platelet was then milled to form a powder with its 50% volume distribution set between 2-5 microns. The glass powders were then formulated with desiccant and/or other filler and organic medium into a thick film composition (or "paste"). The glass content of the present invention in the amount of about 8 to 10 weight %, based on total composition comprising, glass, pre-hydrated desiccant material, and organic medium.

Various desiccant materials such as molecular sieves (or zeolites), alkaline earth metal oxides, metal oxides, sulfates, chlorides, bromides may be selected for getter paste applications. Various types of zeolites are known to be the best candidates in terms of capacity of water absorption due to their intrinsic nature of porous structure.

Zeolites are materials that absorb moisture by physical absorption and may be naturally or synthetically derived. Natural zeolites are hydrated silicate of aluminum and either sodium or calcium or both, of the type $Na_2O$, $Al_2O_3$, $xH_2O$, and $xSiO_2$. Synthetic zeolites are made either by a gel process or a clay process, which forms a matrix to which the zeolite is added. Both natural and synthetic zeolites may be used in the present invention. Well known zeolites include chabazite (also referred to as zeolite D), clinoptilolite, erionite, faujasite (also referred to as zeolite X and zeolite Y), ferrierite, mordenite, zeolite A, and zeolite P. Detailed descriptions of the aforementioned zeolites, as well as others, may be found in D. W. Breck, *Zeolite Molecular Sieves*, John Wiley and Sons, New York, 1974, hereby incorporated by reference. For example, type 3A, 4A and 13X zeolites all have the ability to adsorb water molecules and are presently used as the preferred adsorbent molecular sieve for making the new moisture getter compositions. Such zeolites comprise $Na_2O$, $Al_2O_3$ and $SiO_2$. Certain adsorbent getters can adsorb gaseous contaminants in addition to moisture, such as gaseous $H_2$ and $O_2$. The 3A & 4A zeolites have relatively narrow pore diameters of 3 & 4 angstroms respectively. The narrower pores only allow very small molecules to enter. The 13X zeolite nominally has 10 angstrom pore diameters that are less selective and allow somewhat larger molecules to enter. The 13X zeolite is effective for removing a broader range of molecules including: moisture, oxygen, and small organic molecules. An example of a commercially available, solid getter tablet based on zeolite technology that can be made to adsorb organics, as well as moisture is described in European Patent Application No. WO 02/430098 A1 by Synetix.

For this invention, the desiccant material is pre-hydrated to reach its saturation level of moisture absorption. The process of pre-hydration can be done by exposing the desiccant in a normal temperature/humidity environment of 25° C. and 50-60% RH. for 24 to 48 hours or up to the time when weight gain (due to moisture absorption) stops to occur. An accelerated hydration process in a chamber with higher than normal humidity level (i.e. 50% Relative Humidity) is also applicable to shorten the time of exposure till weight gain stops to occur.

Table 1 illustrates the % weight gain as a function of normal temperature/humidity exposure of commonly used desiccant materials such as zeolite 3A and 13X, with two test specimen for each type. The weight of these powders was monitored to determine the rate of weight gain and the time when the weight of these pre-hydrated powders reached a pseudo steady state. It appears that the weight of both zeolite reached a steady state upon exposure for 46 hours and both samples for each type of zeolite showed consistent weight gain with less than 3% variation for 3A and less than 2% variation for 13X. It was noted, however, that the pseudo steady state weight gain of 3A differed from that of 13X due to the intrinsic differences in size distribution and morphology of the given zeolite particles and pores in the zeolite particles.

TABLE 1

| Exposure Time, hours | % Weight Gain of Zeolite 3A or 13X | | | |
|---|---|---|---|---|
| | 3A - 1 | 3A - 2 | 13X - 1 | 13X - 2 |
| 0.16 | 9.3 | 9.3 | 11.5 | 11.5 |
| 4 | 22.9 | 21.2 | 29.4 | 25.7 |
| 6 | 23.3 | 22.0 | 29.8 | 27.4 |
| 8 | 23.3 | 22.3 | 29.5 | 28.4 |
| 22 | 23.9 | 23.2 | 30.7 | 30.2 |
| 32 | 24.0 | 23.1 | 30.8 | 30.2 |
| 46 | 24.3 | 23.6 | 31.4 | 30.8 |
| 70 | 24.2 | 23.6 | 31.2 | 30.8 |
| 80 | 24.0 | 23.2 | 30.8 | 30.2 |
| 94 | 23.9 | 23.2 | 30.8 | 30.3 |

The pre-hydrated zeolite processed according to the above method was used as the desiccant ingredient in the getter paste compositions. A Thermal Gravitational Analysis (TGA) was used to study the dehydration of the above treated zeolite 13X-1. 35.72 mg of the hydrated 13X-1 was used in the TGA sample holder and the test was carried out in air atmosphere at 10° C./minute heating rate from room temperature to 550° C. The final weight of 27.34 mg reflected a weight loss of 23.47% and was calculated to show 30.67% moisture or small gaseous organic molecule absorption (per 100% anhydrous zeolite) due to the 94-hour exposure treatment. The respective weight loss percentage of the absorbed moisture and/or other small gaseous organic molecule was 22.62% at 100° C., 76.74% at 200° C., 95.34% at 300° C., 99.72% at 400° C., and 100% at 500° C. and beyond. This confirmed the dehydration and hence activation of zeolite after the firing of the getter paste composition in a furnace profile with a peak temperature of 550° C. whereas a range of 400 to 650° C. is applicable depending on the substrate type and available furnace conditions.

The moisture and/or small gaseous organic molecule absorption by desiccant materials, such as zeolite, is through physical instead of chemical interaction between water molecule and the pores in the desiccant materials. Therefore, a reversible water absorption-desorption process continues until a pseudo steady state is reached wherein the rate of water absorption by the zeolite is equivalent to that of water desorption from the zeolite, depending on the specific environmental temperature and relative humidity condition. "Pseudo steady state" means that there may be slight variations in weight due to the reversible water absorption-desorption process. This pseudo steady state weight gain due to the moisture absorption-desorption process may be reached by exposing the dessicant material in an ordinary paste production environment or by exposing the dessicant material in a controlled temperature and humidity environment. Those skilled in the art will understand that an ordinary (thick film) paste production environment can encompass a multitude of temperature and humidity conditions, such as those typically present in a thick film paste production environment.

Without the step of pre-hydration, moisture absorption on the as-received dehydrated zeolite resulted in heat dissipation that raised the temperature of the mixture of paste ingredients and its container prior to, during, or after the paste production process by typically that of 3-roll milling. The extent of moisture absorption depends on the environmental temperature/relative humidity condition and the paste material handling process. Some of the smaller organic molecules from various solvents can also penetrate into the ~10 angstrom diameter pores of the 13X zeolite. Hydration of the zeolite pores effectively blocks most of the organic molecules in the paste from penetrating. Typically a process that creates freshly exposed zeolite such as ingredient mixing or 3-roll milling results in higher rate of moisture absorption. However, the organic medium used in the getter paste is able to passivate the pores in the desiccant, which lowers the rate of absorption. Therefore, the above co-existing mechanisms make the process and material property less controllable. Since stability and consistency of process (such as temperature of material under mixing or 3-roll milling) and material properties (such as paste rheology and its actual moisture content) are both critical, it is necessary to stabilize the water absorption—desorption process as disclosed by this invention.

The above pre-hydrated zeolite powders were used as ingredients in the getter paste composition and found to provide consistent temperature in the paste preparation process wherein the rheology of the resultant paste samples remained stable upon room temperature storage for more than three months.

The amount of pre-hydrated desiccant material added to the composition should be determined based on the necessary capacity to absorb moisture and other small gaseous organic molecules, as dictated by the application. The approximate volume % ratio of desiccant to glass frit ranges from 0 to about 15. The preferred volume % ratio of desiccant to glass frit ranges from 2.1 to 10.

Organic Medium

The organic medium in which the glass and desiccant materials are dispersed is comprised of an organic polymeric binder or mixture of binders dissolved in a volatile organic solvent which, optionally, was added other soluble or dispersible materials such as plasticizers, release agents, dispersing agents, stripping agents, antifoaming agents or wetting agents.

The solids are typically blended with an organic medium by mechanical means to form a cohesive mass, called "premix", and then further dispersed in an equipment such as 3-roll mill to produce a viscous liquid called "paste" having proper dispersion, suitable consistency, and right rheology for screen printing application. A wide variety of chemicals in liquid or solid form can be used as ingredients in an organic medium. The organic medium of choice must be the wherein the solids can be dispersed with a prolonged stability of dispersion upon room temperature storage. The rheological properties of the medium must also provide good patterning capability to the composition by method such as screen-printing. These properties include: dispersion of solids with an adequate degree of stability, appropriate viscosity, shear thinning for ease of screen printing, thixotropy for retention of pattern resolution, appropriate wettability of the substrate and the solids, adequate drying rate, a dried film strength sufficient to withstand rough handling, and adequate properties after firing. The materials suitable to be used in an organic medium are well known in the art and an organic medium is normally made of a solution of polymer dissolved in solvent(s).

The most frequently used polymer for this purpose is ethyl cellulose. Other examples of suitable polymers include ethylhydroxyethyl cellulose, wood rosin, mixtures of ethyl cellulose and phenolic resins, polymethacrylates of lower alcohols, and monobutyl ether of ethylene glycol monoacetate, as well as others known to those skilled in the art.

The most widely used solvents in thick film compositions are ethyl acetate and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. The preferred mediums are based on ethylcellulose and β-terpineol. Various combinations of these and other solvents are formulated to obtain the viscosity, volatility, and screen life necessary to achieve acceptable paste printability and subsequent drying for mass production application.

The ratio of organic medium to the inorganic solids in the thick film paste composition depends on the method of application and the kind of organic medium used. Usually, the dispersion will contain 50-80 weight % of inorganic solids and 20-50 weight % of vehicle or the organic medium in order to obtain acceptable patterning. Within these limits, it is desirable to use the least possible amount of organic binder in order to minimize the amount of organics that must be removed by pyrolysis and to obtain dense particle packing that results in small dimensional shrinkage upon firing. The content of the organic medium is further selected to provide suitable paste consistency and rheology for casting, screen printing, ink-jet printing, or coating by spraying, brushing, syringe-dispensing, doctor blading, and the like.

In general, the thickness of the fired getter pattern depend on the solid content in the getter paste composition, the rheological characteristics such as shear thinning and thixotropy of the organic medium, the dispersion quality and packing density of solids in the paste and in the dried patterned film, the softening point, melt viscosity, and densification behavior of the frit and desiccant materials.

Application of Thick Films

The thick film getter is typically deposited on a substrate, such as glass, low temperature co-fired ceramics (LTCC) or silicone that is impermeable to gases and moisture. The substrate can also be a sheet of flexible and impermeable plastic material, such as polyester, for example polyethylene terephthalate, or a composite material made up of a combination of plastic sheet with optional metallic or dielectric layers deposited thereupon. In one embodiment, the substrate can be transparent (or semi-transparent) to enable light to enter into the encapsulated region or to enable light to be emitted from the encapsulated region through the substrate.

The deposition of thick film getter is performed preferably by screen-printing although other deposition techniques such as stencil printing, syringe dispensing or other deposition or casting techniques can be utilized. In case of screen-printing, parameters such as the screen mesh size, the wire diameter, and the emulsion thickness can be adjusted to obtain desirable thickness of deposited thick film.

The deposited thick film is dried at 100-120° C. for 5-10 minutes in an oven to remove volatile organic solvent(s), and then firing is carried out at 400-650° C. in a standard thick film conveyor belt furnace or in a box furnace with a programmed heating cycle. As used herein, the term "firing" means heating the article in an oxidizing or inert atmosphere such as air, nitrogen or argon to a temperature and for a time sufficient to decompose and volatilize (burn-out) the organic material in the layers of the assemblage and to sinter the remaining glass and filler (such as desiccant) composite material in the layers thus, densifying the thick film layers.

Fired thickness of the film can vary depending on screen mesh size, screen wire diameter, screen emulsion thickness, content of glass and solid % in paste, but typically ranges from 10 to 40 microns. To prevent re-adsorption of volatiles that deactivate the desiccant (for example zeolite), the firing step is often conducted in a controlled oxidizing atmosphere void of moisture and other gases, and in extreme case, vacuum condition can be applied. Firing is usually performed immediately prior to the step of sealing the device into a hermetic container unless the fired panel with getter material is stored in an atmosphere void of moisture and/or other gases. Depending on the specific processing procedure, an additional firing at 400-550° C. to activate (or de-hydrate) the getter layer may be required to evaporate re-absorbed moisture during the storage period.

The humidity sensitivity of fired getter thick films was evaluated by exposing the getter composition to changing humidity conditions, such as different humidity levels, exposure time, and temperature. A thermal gravitational analysis (TGA) analysis was used to quantify the weight loss up to a specific temperature. The evaluation results showed a similar decreasing tendency of weight loss with increasing the glass content and with a much slower rate of weight loss when reaching 400° C. and beyond. In addition, it revealed that most of humidity absorption on a fired getter film occurred within a relatively short time of less than 1 hour of exposure.

Applications

Use in Electronic Display Devices

While the composition of the present invention is described herein below as useful in the formation of a superior PLED device, it is understood by those in the art that the composition of the present invention may be utilized in various types of electronic devices, including, but not limited to the following:

PDP (Plasma Display Panel); CRT (Cathode Ray Tube); FED (Field Emission Display); LCD (Liquid Crystal Display); and LED (Light Emitting Diode).

In one embodiment of the present invention, the pre-hydrated getter composition is utilized in a polymer light-emitting diode (PLED) display device. This device includes the solid-state electronic device made up of the anode and cathode with electrical attaching leads, the layer of electrically active organic polymer, and, in this embodiment, a substrate. The device also includes an encapsulating container isolating the electronic device from the atmosphere. This container comprises the substrate as a base with a cover or lid affixed to the base with a bonding agent. A thin layer of activated adsorbent getter for water, oxygen and/or organic gases is bonded to the interior surface of the lid of the container so that the getter is sealed within the container along with the electronic device.

Other features and advantages of the invention will be apparent from the following detailed description, and from the claims.

The Substrate

The PLED is typically fabricated on a substrate, such as glass or silicone that is impermeable to gases and moisture. The substrate can also be a sheet of flexible material, such as an impermeable plastic such as polyester, for example polyethylene terephthalate, or a composite material made up of a combination of plastic sheet with optional metallic or dielectric layers deposited thereupon. In one embodiment, the substrate can be transparent (or semitransparent) to enable light to enter into the encapsulated region or to enable light to be emitted from the encapsulated region through the substrate.

The Container

The active area of the device can be encapsulated in a container to seal out the environment. For example, the active area can be covered with a covering, such as a lid, that is impermeable to gases and moisture and which is sealed to a gas impermeable substrate or container base. In one embodiment, the covering comprises a metal. In another embodiment, the covering comprises glass or a ceramic material. In one aspect of the invention, an interior surface of the container, such as a lid that seals to the substrate or to a container base, can be used as the surface that is coated with the adsorbent getter materials and heat treated. In such a case, the container, or the portion that serves as the surface to which the getter is bonded, must be selected to withstand heat treating of the getter as described below.

The container can be assembled by sealing the covering to the base of the container (e.g., to the substrate) with a bonding agent, such as a glue or other adhesive. This bonding agent should cure at low temperatures such as below 75° C., below 50° C. or even at ambient temperature so that the device is not exposed to a temperature high enough to damage or degrade the electronic device. Preferred bonding agents for sealing the assembled container include epoxies, either cured by exposure to ultraviolet light or by exposure to moderately elevated temperatures as just noted (or both). Various primer materials may be used to assist in the bonding process.

Electrical leads emanate from the device. These should be sealed as well in a moisture and gas impermeable fashion.

Although the invention is illustrated with reference to PLEDs as the moisture-sensitive electronic device for convenience, other types of moisture sensitive or gas-sensitive electronic devices are contemplated to protected by the new methods of desiccating or degassing an environment surrounding an electronic device. For example, the construction of, and materials used in, photodetecting devices and arrays of devices are very similar to the fabrication of polymer-based LEDs. The main differences between polymer-based LEDs and photodetectors is that reactive low work function electrodes need not be used and electrical polarity of the electrodes is reversed. Nevertheless, hermetically sealed packaging is required for long lifetime of photodetecting devices fabricated from conducting polymers.

The present invention will be discussed in further detail by giving practical examples. The scope of the present invention, however, is not limited in any way by these practical examples.

EXAMPLES

Examples 1-3

A series of bismuth or lead silicate-based glass compositions that have been found to be suitable in the present invention for application to thick film getter paste are shown in Table 2. The examples particularly illustrate silicate glasses containing more than 69 weight % bismuth.

All glasses were prepared by mixing raw materials and then melting in a platinum crucible at 1100-1400° C. The resulting melt was stirred and quenched by pouring on the surface of counter rotating stainless steel rollers or into a water tank. The glass powders prepared for the invention were adjusted to a 2-5 micron mean particle size by wet or dry milling using alumina ball media prior to being used as ingredients in the formulation of a paste composition. In the case of wet milling, the slurry after milling was dried in a hot air oven and the excessively large particles were removed by a sieving process.

It is noted that the examples of glass composition given below only serve as several of the candidates suitable for this invention; the application of this invention is therefore not limited to the three glass compositions herein. The glass compositions were identified based on dilatometer softening point among other factors that support the densification and adhesion of the getter paste compositions of this invention. For example, glass 1, 2, or 3 below has respectively a softening point of 453, 453, or 370° C. Furthermore, the intrinsic density (not bulk density) of the aforementioned is respectively 5.96, 5.16, or 7.20 gram per cubic centimeter.

TABLE 2

| | Glass composition in weight % | | |
|---|---|---|---|
| Ex. # | 1 | 2 | 3 |
| $SiO_2$ | 7.1 | 14.8 | 3.5 |
| $Al_2O_3$ | 2.1 | 0.8 | 3.5 |
| $Bi_2O_3$ | 69.8 | | 82.0 |
| $B_2O_3$ | 8.4 | 11.8 | |
| CaO | 0.5 | | |
| ZnO | 12.0 | 6.6 | |
| PbO | | 66.0 | 11.0 |

Examples 4-19

Thick film getter paste was prepared by mixing glass and pre-hydrated desiccant (3A or 13X powder) material (molecular sieve) with organic media based on the mixture of Texanol® and/or terpineol solvent and ethyl cellulose resin. Table 3 represents the examples of thick film compositions containing 7-10% glass and 47-60% pre-hydrated zeolite (3A or 13X). Although identical level of glass to pre-hydrated zeolite, namely, 1 to 6.1 for glass 1 to pre-hydrated 3A and 1 to 6.5 for glass 1 to pre-hydrated 13X, it is noted that a glass to pre-hydrated zeolite ratio other than the aforementioned value can be applicable in the getter paste compositions depending on the specific requirements in adhesion strength and the getter effect. Due to the density differential of glass among the glass compositions 1 to 3, the relative weight % glass in paste composition containing other than glass 1 was adjusted to maintain identical volume ratio of glass to zeolite 3A (Table 3) or 13X (Table 4). Particularly, example 10 or 18 of paste compositions containing glass 2 is equivalent to 6 or 14; and example 11 or 19 of paste compositions containing glass 3 is equivalent to 7 or 15. In order to provide similar rheology of the paste composition examples, two organic mediums 1 and 2 were used, wherein medium 1 is a lower viscosity version of ethyl cellulose in terpineol and medium 2 is a higher viscosity version of the same type of ingredients. It is noted, for the purpose of viscosity adjustment that various ethyl cellulose molecular weight, its distribution, and the ethyl cellulose content in the solvent can be used in both organic mediums.

The getter paste was printed using a 200 mesh screen on a glass lid substrate based on soda-lime silicates, dried at 120° C. for 10 minutes to evaporate the solvent(s), and then fired at a peak temperature of 450-550° C. for 1-2 hours in a box furnace. Some samples were also processed at 550° C. for 1 hour using a conveyor furnace with a heating/cooling profile of about 6 hours. The printing/drying step was repeated to generate thicker getter films when needed. The fired thickness of single-printed thick film ranged from 10 microns to 40 microns, depending on paste viscosity, % solid content, screen mesh size, screen wire diameter, screen emulsion thickness, and the setup parameters on the screen printer.

The thick film fired dense and showed good adhesion with the glass substrate. No cracking or blistering was observed on the surface of fired thick films. Good thickness uniformity of fired film was kept within +/−2 micron regardless of the paste composition.

The densification degree of fired samples depended on the relative content of glass. A higher content of glass was desirable for better densification of thick films and stronger bonding to the glass lid substrate. However, a lower glass to desiccant ratio provides more desiccant effect. Therefore, it is necessary to evaluate between the two properties and determine the optimal combination.

TABLE 3

| Thick film getter composition in weight % | | | | | | | | |
|---|---|---|---|---|---|---|---|---|
| Example | 4 | 5 | 6 | 7 | 8 | 9 | 10 | 11 |
| Glass Type | 1 | 1 | 1 | 1 | 1 | 1 | 2 | 3 |
| Glass | 8.72 | 8.37 | 7.77 | 9.78 | 9.67 | 8.95 | 6.73 | 11.81 |
| Zeolite 3A | 53.81 | 51.66 | 47.96 | 60.34 | 59.69 | 55.24 | 47.96 | 60.34 |
| Medium 1 | 6.97 | 7.44 | 11.36 | 7.82 | 8.59 | 13.09 | 11.36 | 7.82 |
| Medium 2 | 0.87 | 0.93 | 1.94 | 0.97 | 1.07 | 2.23 | 1.94 | 0.97 |
| Surfactant | 0.87 | 0.93 | 0.97 | 0.97 | 1.07 | 1.35 | 0.97 | 0.97 |
| Solvent | 28.76 | 30.67 | 30.00 | 20.12 | 19.91 | 19.14 | 31.04 | 18.09 |

TABLE 4

| Thick film getter composition in weight % | | | | | | | | |
|---|---|---|---|---|---|---|---|---|
| Example | 12 | 13 | 14 | 15 | 16 | 17 | 18 | 19 |
| Glass Type | 1 | 1 | 1 | 1 | 1 | 1 | 2 | 3 |
| Glass | 8.46 | 8.13 | 7.68 | 9.46 | 9.35 | 8.70 | 6.65 | 11.43 |
| Zeolite 13X | 55.18 | 53.03 | 50.09 | 59.98 | 59.25 | 55.16 | 50.09 | 59.98 |
| Medium 1 | 6.77 | 7.23 | 7.68 | 7.57 | 8.30 | 12.72 | 7.68 | 7.57 |
| Medium 2 | 0.84 | 0.90 | 1.92 | 0.94 | 1.03 | 2.17 | 1.92 | 0.94 |
| Surfactant | 0.84 | 0.90 | 0.96 | 0.94 | 1.03 | 1.09 | 0.96 | 0.94 |
| Solvent | 27.91 | 29.81 | 31.67 | 21.11 | 21.03 | 20.16 | 30.64 | 19.14 |

Examples 20-22

Fired thick film samples were evaluated to quantify the degree of moisture absorption after exposure to certain humidity environment. Table 5 shows the absorption performance of selected getter samples 15 to 17 based on the thermal gravitational analysis (TGA) results. The moisture desorption and absorption results were expressed as weight loss and gain of thick films up to a given temperature. The TGA samples were prepared by firing at a peak temperature of 550° C. for 30 minutes and exposing to an 85° C./85% RH humidity condition for 2 hours including the time took to cool from 550° C. to room temperature. No additional firing for activation (i.e. to remove moisture absorbed by the zeolite materials) was used for the TGA analysis.

The weight loss proportionally increased with increasing temperature during the firing profile as expected, but it tends to demonstrate a much slower rate of weight loss after 400° C. Increasing the content of glass decreased the percentage of weight loss. This tendency is reasonable when considered the fact that the absorption capability is dominantly determined by the relative content of the desiccant materials. The glass is believed to generally act as an inorganic binder and/or an adhesion promoter and is normally unable to absorb water. Assuming all of the organic solvent(s) contained in the paste compositions 15 to 17 was evaporated wherein the organic polymer resin (i.e. ethyl cellulose) and surfactant remained intact during the initial getter paste drying step at 120° C. for 10 minutes, the calculated weight % water retained in the zeolite 13X in the dried getter film was respectively, 21.26, 21.51, or 20.75% (row E in Table 5), this was further calculated to represent 33.42, 34.05, or 33.08 weight % based on the existing 13X in the getter film made from the paste 15, 16, or 17, respectively. These values exceeded the measured weight gain (26.8%, row F) due to the pre-hydration of the 13X and were attributed to the retained volatile solvent(s) in the dried getter film, either brought in by simple solvent(s) addition or from the organic mediums 1 and 2. Furthermore, the TGA measured weight gain (row H) due to the exposure of the fired getter film was used to calculate the water re-absorption on 13X in the fired getter film as respectively, 29.76, 29.76, or 30.48% based on the weight of 13X. This, while larger than the measured 13X weight gain (row G) is not unreasonable due to the degree of a more complete dehydration (or activation) of zeolite by the 550° C. firing cycle than the as-received zeolite from the supplier. That is to say that the as-received 13X may not be totally free from moisture absorption and/or partial moisture absorption occurred in the storage period.

TABLE 5

Thick Film getter composition in weight %
(based on solid %) and weight loss in %

| ID | Description | 15 | 16 | 17 |
|---|---|---|---|---|
| A | Measured % Weight Loss from dried to fired getter paste | 23.7 | 24.2 | 24.6 |
| B | Wt % frit in the dried getter film per recipe | 12.72 | 12.63 | 12.57 |
| C | Wt % dehydrated 13X in the dried getter film per recipe | 63.58 | 63.17 | 62.86 |
| D | Wt % nonvolatile organic materials in the dried getter film | 2.44 | 2.69 | 3.82 |
| E | Calculated wt % water absorbed in 13X in the dried getter film | 21.26 | 21.51 | 20.75 |
| F | Calculated wt % water vs. 13X | 33.42 | 34.05 | 33.08 |
| G | Measured % weight gain from 13X due to exposure | 26.8 | 26.8 | 26.8 |
| H | Measured % weight gain from fired getter film upon treatment | 24.8 | 24.8 | 25.4 |
| I | Calculated % weight gain of 13X due to moisture absorption | 29.76 | 29.76 | 30.48 |

What is claimed is:

1. A process for making a screen-printable getter paste composition, comprising 50-80 weight % of inorganic solids and 20-50 weight % of an organic medium, said process comprising: dispersing glass frit and a desiccant material selected from the group consisting of zeolites, alkaline earth metal oxides, sulfates, chlorides and bromides in an organic medium comprised of organic polymeric binder and volatile organic solvent, wherein said desiccant material is pre-hydrated to reach its saturation level of moisture absorption prior to its being dispersed in said organic medium; wherein said desiccant material is hydrated by exposing said material in an ordinary paste production environment to reach pseudo steady state weight gain due to the moisture absorption or wherein said desiccant is hydrated by exposing the material in a controlled temperature and humidity environment to reach pseudo steady state weight gain due to the moisture absorption.

2. The process of claim 1, wherein said organic polymeric binder is selected from the group comprising ethyl cellulose, ethyl hydroxyethy cellulose, wood rosin, mixtures of ethyl cellulose and phenolic resins, polymethacrylates of lower alcohols, monobutyl ether of ethylene glycol monoacetate, and mixtures thereof.

3. The process of claim 2, wherein said volatile organic solvent is selected from the group comprising ethyl acetate, terpene, kerosene, dibutyl phthalate, butyl carbitol, butyl carbitol acetate, hexylene glycol, high boiling alcohols, alcohol esters, and mixture thereof.

4. The process of claim 1, wherein said desiccant is a zeolite.

5. The process of claim 1, wherein said glass frit comprises $Bi_2O_3$ and 0.8-30 wt % $Al_2O_3$.

6. The process of claim 5, wherein said glass further comprises, based on the weight of said glass frit 1-50% $SiO_2$, 0-80% $B_2O_3$, 0-90% PbO, 0-90% $P_2O_5$, 0-60% $Li_2O$, 0-10% $K_2O$, 0-10% $Na_2O$, and 0-30% MO where M is selected from Ba, Sr, Ca, Zn, Mg and mixtures thereof.

* * * * *